United States Patent
Chien et al.

(10) Patent No.: US 11,869,613 B2
(45) Date of Patent: Jan. 9, 2024

(54) SEMICONDUCTOR STRUCTURE AND ENDURANCE TEST METHOD USING THE SAME

(71) Applicant: MACRONIX INTERNATIONAL CO., LTD., Hsinchu (TW)

(72) Inventors: Wei-Chih Chien, New Taipei (TW); Hsiang-Lan Lung, Kaohsiung (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 74 days.

(21) Appl. No.: 17/574,629

(22) Filed: Jan. 13, 2022

(65) Prior Publication Data

US 2023/0130293 A1 Apr. 27, 2023

Related U.S. Application Data

(60) Provisional application No. 63/270,061, filed on Oct. 21, 2021.

(51) Int. Cl.
*G11C 29/12* (2006.01)
*G11C 11/402* (2006.01)

(52) U.S. Cl.
CPC ............ *G11C 29/12* (2013.01); *G11C 11/402* (2013.01)

(58) Field of Classification Search
CPC .............................. G11C 29/12; G11C 11/402
See application file for complete search history.

(56) References Cited

U.S. PATENT DOCUMENTS

| 7,111,210 | B2 * | 9/2006 | Nagahashi | G11C 29/50 |
| | | | | 714/724 |
| 8,697,487 | B2 * | 4/2014 | Ho | H10N 70/20 |
| | | | | 257/4 |
| 10,128,312 | B2 * | 11/2018 | Wu | H10B 61/10 |

* cited by examiner

*Primary Examiner* — Vanthu T Nguyen
(74) *Attorney, Agent, or Firm* — McClure, Qualey & Rodack, LLP

(57) ABSTRACT

A semiconductor structure is provided. The semiconductor structure includes a transistor and a memory device. The transistor includes a source, a drain, and a gate. The memory device is disposed at a drain side of the transistor and coupled to the drain. The memory device includes a first electrode, a switch layer, a memory layer, and a second electrode disposed sequentially. The first electrode is coupled to the drain.

8 Claims, 4 Drawing Sheets

SEMICONDUCTOR STRUCTURE AND ENDURANCE TEST METHOD USING THE SAME

This application claims the benefit of U.S. provisional application Ser. No. 63/270,061, filed Oct. 21, 2021, the subject matter of which is incorporated herein by reference.

TECHNICAL FIELD

This disclosure relates to a semiconductor structure and an endurance test method using the same. More particularly, this disclosure relates to a semiconductor structure comprising a memory device and an endurance test method for a memory device using the same.

BACKGROUND

As the development of computers, the requirement for stability of memory devices becomes higher. Recently, there have been more and more discussions on the design of non-volatile memory, which includes phase change memory, resistive random access memory (ReRAM), magnetoresistive random access memory (MRAM), ferroelectric random access memory (FeRAM), etc. In some implementations, a switch may be incorporated into a memory for the reason of preventing sneak current and so on. The test of the stability for a memory device is important. However, a simple method for testing endurance of memory devices is still be desired.

SUMMARY

The disclosure is directed to a semiconductor structure and an endurance test method using the same. According to the disclosure, endurance of a memory device can be tested in a simple and even time-saving way.

A semiconductor structure according to the disclosure is provided. The semiconductor structure comprises a transistor and a memory device. The transistor comprises a source, a drain, and a gate. The memory device is disposed at a drain side of the transistor and coupled to the drain. The memory device comprises a first electrode, a switch layer, a memory layer, and a second electrode disposed sequentially. The first electrode is coupled to the drain.

An endurance test method according to the disclosure is provided. The endurance test method uses a semiconductor structure comprising a memory device to be tested. The method comprises following steps. First, the semiconductor structure is provided. The semiconductor structure comprises a transistor and the memory device. The transistor comprises a source, a drain, and a gate. The memory device is disposed at a drain side of the transistor and coupled to the drain. The memory device comprises a first electrode, a switch layer, a memory layer, and a second electrode disposed sequentially. The first electrode is coupled to the drain. Then, a constant current stress is applied to the memory device through the transistor. The constant current stress comprises at least one cycle each including a pulse. Electric characteristics of the memory device corresponding to the constant current stress are tested, and tested results are obtained. Thereafter, endurance of the memory device is obtained using the tested results.

Figure 1:
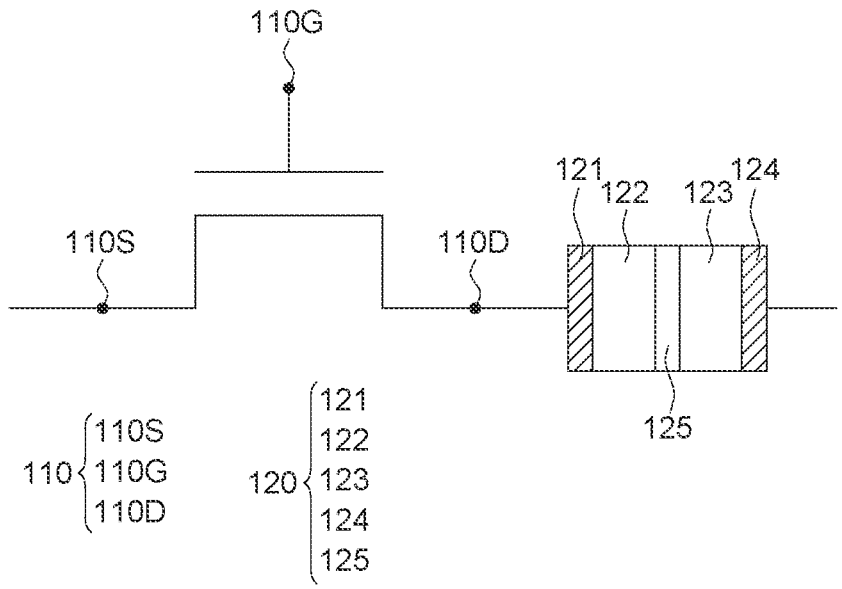
FIG. 1 illustrates an exemplary semiconductor structure according to embodiments.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Various embodiments will be described more fully hereinafter with reference to accompanying drawings. The following description and the accompanying drawings are provided for illustrative only, and not intended to result in a limitation. In addition, the components may not be drawn to scale for the reason of clarity. Elements of a structure may be replaced, added, or modified in any suitable manner, and steps of a method may be combined, added, or modified in any possible conditions, as long as the spirit of the disclosure can be satisfied. It is contemplated that the elements and features of one embodiment can be beneficially incorporated in another embodiment without further recitation.

Referring to FIG. 1, an exemplary semiconductor structure 10 is shown. The semiconductor structure 10 comprises a transistor 110 and a memory device 120. The transistor 110 comprises a source 110S, a drain 110D, and a gate 110G. The memory device 120 is disposed at a drain side of the transistor 110 and coupled to the drain 110D. The memory device 120 comprises a first electrode 121, a switch layer 122, a memory layer 123, and a second electrode 124 disposed sequentially. The first electrode 121 is coupled to the drain 110D.

The transistor 110 may be any commonly used transistor with or without a suitable modification that has been known or will be developed in the future. As such, the details of the transistor 110 are omitted herein.

Similarly, the first electrode 121 and the second electrode 124 may comprise any commonly used material and have any suitable configurations, as long as the spirit of the disclosure can be satisfied. As such, the details of the first electrode 121 and the second electrode 124 are also omitted herein.

The switch layer 122 may be any suitable switch layer. According to some embodiments, the switch layer 122 may be an ovonic threshold switch (OTS) layer. In such conditions, the switch layer 122 may comprise a GeSeAs based material ($Ge_xSe_yAs_z$). In addition, the GeSeAs based material may be doped with Si, In, or C. However, the disclosure is not limited thereto. According to some other embodiments, the switch layer 122 may comprise $MoS_2$, Ag-doped $HfO_x$, or the like. According to still some other embodiments, the switch layer 122 may comprise a poly diode.

The memory layer 123 may be any suitable memory layer. According to some embodiments, the memory layer 123 may be a phase change memory layer. In such conditions, the memory layer 123 may comprise a GeSbTe based material ($Ge_xSb_yTe_z$), such as $Ge_1Sb_1Te_1$, $Ge_1Sb_2Te_1$, $Ge_1Sb_3Te_1$, $Ge_1Sb_4Te_1$, $Ge_1Sb_5Te_1$, $Ge_1Sb_6Te_1$, $Ge_2Sb_2Te_5$, $Ge_2Sb_2Te_6$, $Ge_2Sb_3Te_5$, $Ge_2Sb_4Te_5$, or a GeGaSb based material ($Ge_xGa_ySb_z$). In addition, the GeSbTe based material or the GeGaSb based material may be doped with SiOx or SiN. However, the disclosure is not limited thereto. According to some other embodiments, the memory layer 123 may be a ReRAM layer, a MRAM layer, a FeRAM layer, or the like.

According to some embodiments, the memory device 120 may further comprise a barrier layer 125 between the switch layer 122 and the memory layer 123, so as to prevent the diffusion between the switch layer 122 and the memory layer 123. The barrier layer may be formed of C (carbon). However, the disclosure is not limited thereto.

Figure 2:
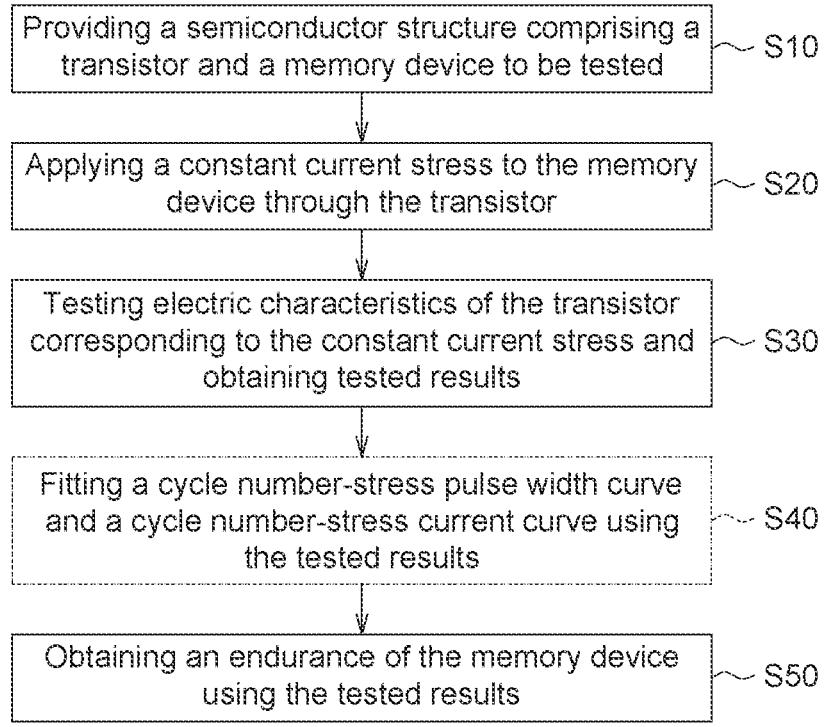
FIG. 2 is an exemplary flow diagram of an endurance test method according to embodiments.

Referring to FIG. 2, an exemplary flow diagram of an endurance test method 20 according to embodiments is shown. The endurance test method 20 uses a semiconductor structure comprising a memory device to be tested. The endurance test method 20 comprises following steps.

In a step S10, the semiconductor structure is provided. The semiconductor structure comprises a transistor and the memory device. More specifically, the semiconductor structure comprising the memory device to be tested may be the same as the semiconductor structure 10 as described above. As such, the details of the semiconductor structure comprising the memory device to be tested are omitted hereinafter.

In a step S20, a constant current stress is applied to the memory device through the transistor. The constant current stress comprises at least one cycle each including a pulse. The constant current stresses may be conducted with a current from 1 µA to 1 mA. For example, the current may be 25 µA, 80 µA, 300 µA, or 500 µA. A pulse width t (shown in FIG. 3) of the pulse may be from 100 ns (nanosecond) to 10 ms (millisecond). For example, the pulse width t may be 100 ns, 1 ms, or 10 ms. An interval between the pulse may be from 100 ns to 1 ms. A cycle number of the constant current stress (i.e., how many cycle(s) included in the constant current stress) may be selected from the group consisting of $10^0, 10^1, 10^2, \ldots, 10^n$, wherein n is a positive integer. However, the disclosure is not limited thereto.

In a step S30, electric characteristics of the memory device corresponding to the constant current stress are tested, and tested results are obtained. According to some embodiments, said testing electric characteristics of the memory device corresponding to the constant current stress may comprises setting and reading the memory device after applying the constant current stress. The desired tested results may vary depending on the types of the memory device. For example, when a two terminals memory device storing data with different threshold voltages for SET and RESET states is to be tested, the desired tested results may comprise a relation between leaky current and cycle number, a relation between threshold voltage and cycle number, a relation between cycle number and stress pulse width (i.e., the pulse width of the constant current stresses), a relation between cycle number and stress current (i.e., current of the constant current stresses), and so on. However, the disclosure is not limited thereto.

The step S20 (i.e., said applying the constant current stress to the memory device) and the step S30 (i.e., said testing electric characteristics of the memory device corresponding to the constant current stress and obtaining tested results) may be repeated a plurality of times. In such conditions, the constant current stresses applied to the memory device in each time have different cycle numbers, and the cycle numbers may be selected from the group consisting of $10^0, 10^1, 10^2, \ldots, 10^n$, wherein n is a positive integer. For example, n may be but not limited to 5. The constant current stresses applied to the memory device in each time are conducted with a same current from 1 µA to 1 mA. The constant current stresses applied to the memory device in each time are conducted with a same pulse, and a pulse width t may be from 100 ns to 10 ms.

Figure 3:
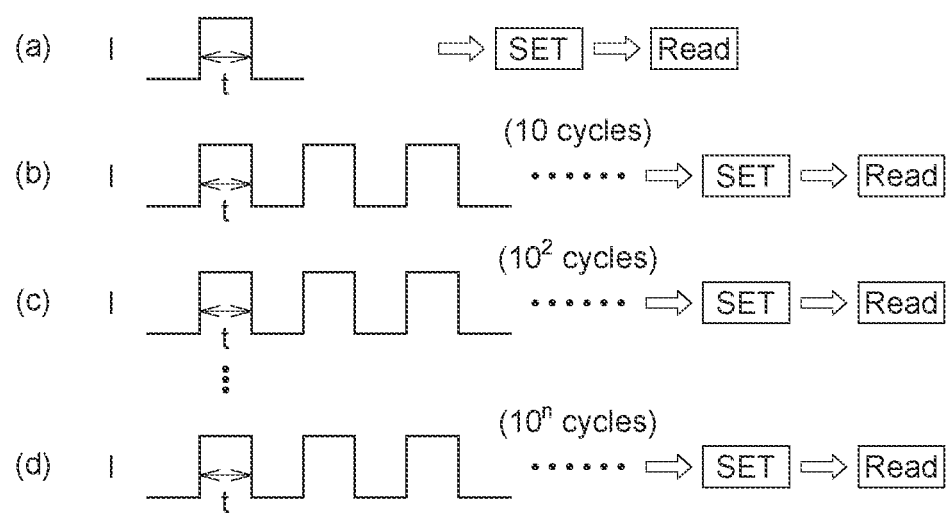
FIG. 3 illustrates details of exemplary steps of the endurance test method according to embodiments.

Referring to FIG. 3, details of one such condition are exemplarily provided. FIG. 3(a) illustrates a first repetition of the step S20 and the step S30, in which the constant current stress comprises 1 cycle. After 1 pulse is applied to the memory device, the memory device is set and read. FIG. 3(b) illustrates a second repetition, in which the constant current stress comprises 10 cycles. After 10 pulses are applied to the memory device, the memory device is set and read. FIG. 3(c) illustrates a third repetition, in which the constant current stress comprises 100 cycles. After 100 pulses are applied to the memory device, the memory device is set and read. FIG. 3(d) illustrates a $n^{th}$ repetition, in which the constant current stress comprises $10^n$ cycles. After $10^n$ pulses are applied to the memory device, the memory device is set and read.

Referring back to FIG. 2, after the step S20 and the step S30, the endurance test method 20 may further comprise an optional step S40. In the step S40, a cycle number-stress pulse width curve and a cycle number-stress current curve may be fitted using the tested results. It is founded that the cycle number-stress pulse width curve and the cycle number-stress current curve can substantially be linear curves, and thus they are suitable for predicting performance of the memory device under an untested condition based on performances of the memory device under tested conditions.

In a step S50, endurance of the memory device is obtained using the tested results. In some embodiments, the endurance of the memory device may be obtained directly from the tested results. In some embodiments, the endurance of the memory device may be obtained by a prediction using at least one of the cycle number-stress pulse width curve or the cycle number-stress current curve.

Now a specific example is provided to enhance understanding of the endurance test method 20. A semiconductor structure has the configuration as shown in FIG. 1 is used, wherein the switch layer 122 is a doped $Ge_xSe_yAs_z$ OTS layer having a thickness of 20 nm, the memory layer 123 is a $Ge_1Sb_1Te_1$ phase change memory layer having a thickness of 80 nm, and the barrier layer 125 is a carbon layer having a thickness of 10 nm. Tested results thereof are shown in FIG. 4 to FIG. 7.

Figure 4:
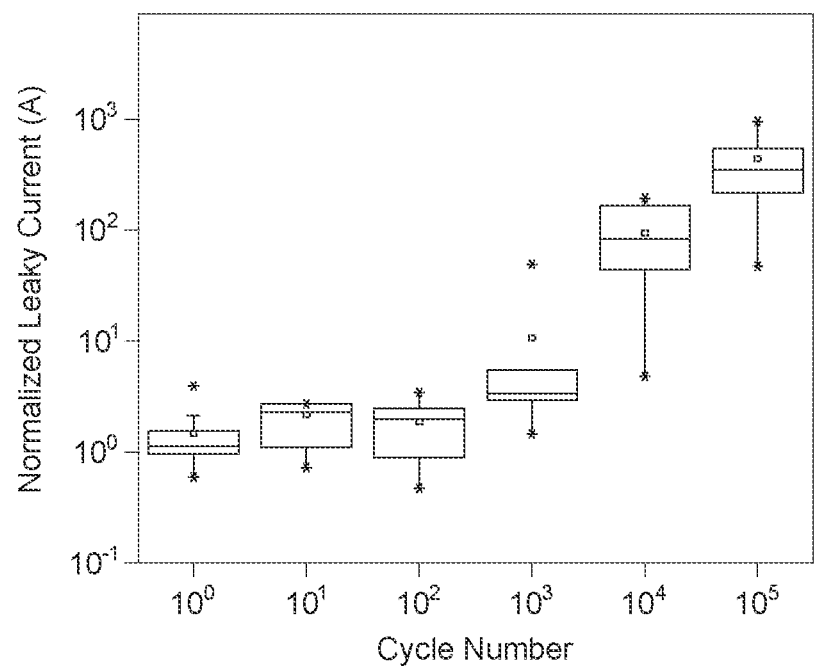
FIGS. 4-7 are results of a specific example of the endurance test method according to embodiments.

FIG. 4 shows a relation between leaky current and cycle number under a condition that the current is fixed at 500 µA and the pulse width is 1 ms. The leaky current increases drastically after $10^4$ cycles. As such, FIG. 4 shows that endurance of the memory device should be $10^3$ cycles, and the memory device is obviously damaged after $10^4$ cycles.

Figure 5:
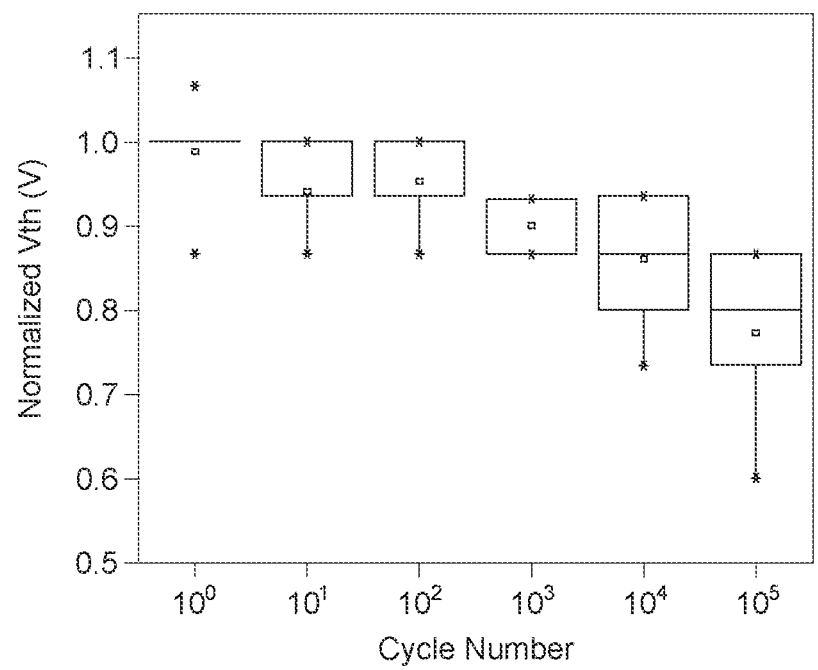

FIG. 5 shows a relation between threshold voltage and cycle number under a condition that the current is fixed at 500 µA and the pulse width is 1 ms. The threshold voltage degrades more than 10% after $10^4$ cycles. In such conditions, it is difficult to identify whether the state of the memory device to be "0" or "1". As such, FIG. 5 also shows that endurance of the memory device should be $10^3$ cycles, and the memory device is obviously damaged after $10^4$ cycles.

Figure 6:
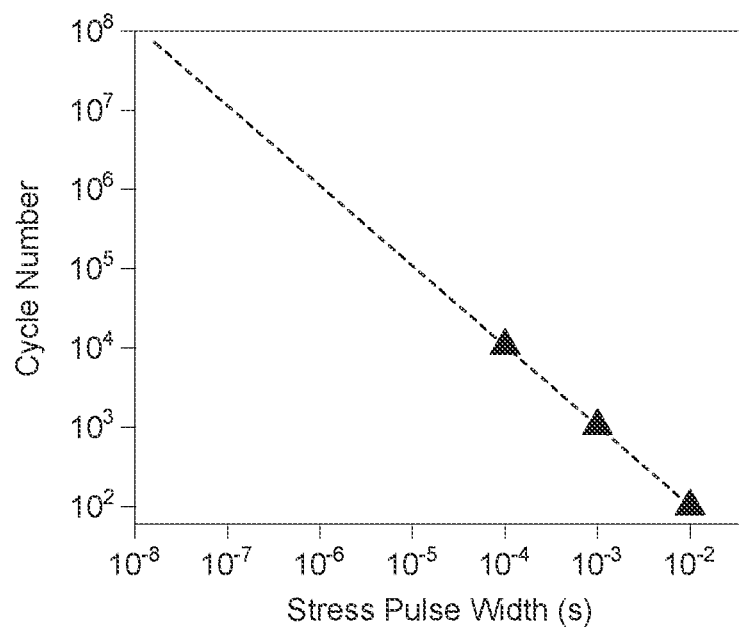

FIG. 6 shows a relation between cycle number and stress pulse width under a condition that the current is fixed at 500 µA. As shown in FIG. 6, a memory device applied with shorter pulse width can endure more cycles. Since a linear cycle number-stress pulse width curve can be fitted using the tested results obtained at conditions of longer pulse widths, endurance of the memory device under a shorter pulse width can be predicted using the fitted curve. In other words, endurance of the memory device under a shorter pulse width can be predicted based on the tested results obtained at conditions of longer pulse widths. For example, the endurance under 1 ms obtained by the tested results (as shown in FIG. 4 and FIG. 5) is $10^3$ cycles. A typical pulse width applied to the memory device in actual use is only 100 ns. From FIG. 6, it can be predicted that endurance under 100 ns will be 10,000 times of the endurance under 1 ms, and thus should be $10^7$ cycles. As such, it is unneeded to spend the time of $10^7$ cycles to obtain the endurance under actually used 100 ns. According to the disclosure, only the time of $10^4$ cycles is needed. The test time and cost can be reduced significantly.

Figure 7:
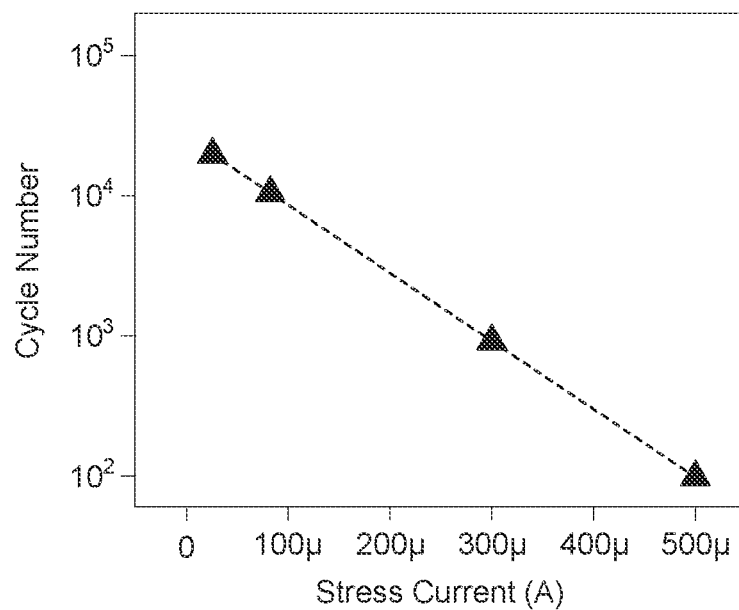

FIG. 7 shows a relation between cycle number and stress current under a condition that the pulse width is 10 ms. As shown in FIG. 7, a memory device applied with lower current can endure more cycles. A linear cycle number-stress current curve can be fitted, and thus the relationship between endurance and applied current can be obtained. For example, the endurance under 500 μA and 100 ns is $10^7$ cycles. From FIG. 7, it can be predicted that endurance under 50 μA will be 100 times of the endurance under 500 μA, and thus should be $10^9$ cycles. It is unneeded to spend the time of $10^9$ cycles to obtain the endurance under 50 μA and 100 ns. According to the disclosure, only the time for manufacturing the diagram of cycle number vs. stress current is needed. As such, the test time and cost can be reduced significantly.

Accordingly, endurance of the memory device having a 20 nm switch layer formed of doped $Ge_xSe_yAs_z$, a 80 nm memory layer formed of $Ge_1Sb_1Te_1$, and a 10 nm barrier layer 125 formed of carbon can be obtained. The write endurance under typically used 500 μA and 100 ns is $10^7$ cycles, which is predicted using FIG. 6 and is further confirmed by an experiment (not provided herein). The read endurance under typically used 50 μA and 100 ns is $10^9$ cycles, which is further predicted using FIG. 7.

From the embodiments and examples as described above, the semiconductor structure and the endurance test method using the same of the disclosure should be clearly understood. According to the disclosure, endurance of a memory device can be tested in a simple way. The test time and cost can be reduced. The through put for endurance test can be improved. While not specifically indicated above, it can be appreciated that any suitable memory device, particularly any suitable two terminals memory device, can be tested using the endurance test method according to the disclosure.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. An endurance test method, the endurance test method using a semiconductor structure comprising a memory device to be tested, the endurance test method comprising:
   providing the semiconductor structure, the semiconductor structure comprising a transistor and the memory device, wherein the transistor comprises a source, a drain, and a gate, the memory device is disposed at a drain side of the transistor and coupled to the drain, the memory device comprises a first electrode, a switch layer, a phase change memory layer, and a second electrode disposed sequentially, and the first electrode is coupled to the drain;
   applying a constant current stress to the memory device through the transistor, wherein the constant current stress comprises at least one cycle each including a pulse;
   testing electric characteristics of the memory device corresponding to the constant current stress and obtaining tested results; and
   obtaining endurance of the memory device using the tested results;
   wherein the tested results including a relation between the number of the at least one cycle and a stress pulse width of the pulse;
   wherein the memory device further comprises a barrier layer between the switch layer and the phase change memory layer, and the barrier layer is formed of carbon.

2. The endurance test method according to claim 1, wherein said testing electric characteristics of the memory device corresponding to the constant current stress comprises:
   setting and reading the memory device after applying the constant current stress.

3. The endurance test method according to claim 1, wherein before said obtaining the endurance of the memory device, said applying the constant current stress to the memory device and said testing electric characteristics of the memory device corresponding to the constant current stress and obtaining tested results are repeated a plurality of times.

4. The endurance test method according to claim 3, wherein the constant current stresses applied to the memory device in each time are conducted with a same current from 1 μA to 1 mA.

5. The endurance test method according to claim 3, wherein the constant current stresses applied to the memory device in each time have different cycle numbers, and the cycle numbers are selected from the group consisting of $10^0$, $10^1$, $10^2$, . . . , $10^n$, wherein n is a positive integer.

6. The endurance test method according to claim 3, wherein the constant current stresses applied to the memory device in each time are conducted with a same pulse, and the pulse width is from 100 ns to 10 ms.

7. The endurance test method according to claim 3, further comprising:
   fitting a cycle number-stress pulse width curve and a cycle number-stress current curve using the tested results.

8. The endurance test method according to claim 7, wherein the endurance of the memory device is obtained by a prediction using at least one of the cycle number-stress pulse width curve or the cycle number-stress current curve.

* * * * *